United States Patent
Coffy

(10) Patent No.: US 7,737,565 B2
(45) Date of Patent: Jun. 15, 2010

(54) STACKABLE SEMICONDUCTOR PACKAGE AND METHOD FOR ITS FABRICATION

(75) Inventor: Romain Coffy, La Tronche (FR)

(73) Assignee: STMicroelectronics, Montrouge (FR)

( * ) Notice: Subject to any disclaimer, the term of this patent is extended or adjusted under 35 U.S.C. 154(b) by 657 days.

(21) Appl. No.: 11/601,569

(22) Filed: Nov. 17, 2006

(65) Prior Publication Data

US 2007/0114654 A1      May 24, 2007

(30) Foreign Application Priority Data

Nov. 21, 2005 (FR) .................................. 05 11766

(51) Int. Cl.
*H01L 23/28* (2006.01)
(52) U.S. Cl. .................................. 257/787; 257/786
(58) Field of Classification Search .................. 257/686, 257/777, 787, 778, 786, 784
See application file for complete search history.

(56) References Cited

U.S. PATENT DOCUMENTS

| | | | |
|---|---|---|---|
| 5,608,265 A * | 3/1997 | Kitano et al. ................ 257/738 |
| 5,648,683 A | 7/1997 | Takahashi et al. | |
| 5,973,393 A * | 10/1999 | Chia et al. .................. 257/690 |
| 6,489,676 B2 * | 12/2002 | Taniguchi et al. ........... 257/698 |
| 7,067,911 B1 * | 6/2006 | Lin et al. ..................... 257/686 |
| 7,208,825 B2 * | 4/2007 | Pu et al. ...................... 257/686 |
| 7,242,081 B1 * | 7/2007 | Lee ............................. 257/686 |
| 7,345,361 B2 * | 3/2008 | Mallik et al. ................ 257/686 |
| 2002/0190396 A1 | 12/2002 | Brand | |
| 2003/0194834 A1 | 10/2003 | Watase et al. | |
| 2004/0036164 A1 | 2/2004 | Koike et al. | |
| 2004/0262728 A1 | 12/2004 | Sterrett et al. | |
| 2005/0116321 A1 | 6/2005 | Li et al. | |

OTHER PUBLICATIONS

Preliminary French Search Report, FR 05 11766, dated Aug. 3, 2006.

* cited by examiner

*Primary Examiner*—S. V Clark
(74) *Attorney, Agent, or Firm*—Gardere Wynne Sewell LLP

(57) ABSTRACT

A stackable semiconductor package includes a board having first electrical connections, an integrated circuit chip fixed on a front face of the board, second electrical connections which connect the chip to the first electrical connections of the board and front electrical contact terminals arranged beyond at least one edge of the chip on the front face of this board. An encapsulation block of a coating material is formed on the front face of the board and encapsulates the chip, its electrical connections and the front terminals. The block has at least one opening which at least partially uncovers the front terminals with a view to receiving electrical connection beads of a stacked second package. This one opening is preferably in the form of a groove.

17 Claims, 4 Drawing Sheets

STACKABLE SEMICONDUCTOR PACKAGE AND METHOD FOR ITS FABRICATION

PRIORITY CLAIM

The present application claims priority from French Application for Patent No. 05 11766 filed Nov. 21, 2005, the disclosure of which is hereby incorporated by reference.

BACKGROUND OF THE INVENTION

1. Technical Field of the Invention

The present invention relates to the field of semiconductor packages and, more particularly, to that of stackable semiconductor packages.

2. Description of Related Art

A stackable package is known in the art which comprises a board carrying on its front face an integrated circuit chip fixed by means of electrical connection beads embedded in a coating material between the board and the chip. On its front face, the board carries front electrical contact terminals around and at a distance from the periphery of the chip.

A stackable package is also known in the art which comprises a board carrying on its front face an integrated circuit chip fixed by adhesive bonding, wires for electrically connecting the chip to the board and an encapsulation block coating the chip and these wires. The board carries front electrical contact terminals on its front face, which are arranged beyond the periphery of this encapsulation block of the chip.

It is known to stack a second semiconductor package on each of the aforementioned semiconductor packages, the electrical connection between this second package and the first semiconductor package being produced by electrical connection beads interposed between the terminals of the rear face of the second package and the front terminals of the first package.

There is a need in the art to provide a semiconductor package which has a different design and can advantageously be stacked.

SUMMARY OF THE INVENTION

An embodiment of the present invention firstly relates to a semiconductor package which comprises a board having electrical connection means, an integrated circuit chip fixed on a front face of the board, means for electrically connecting the chip to the electrical connection means of the board, the electrical connection means of the board comprising front electrical contact terminals arranged beyond at least one edge of the chip on the front face of this board.

According to an aspect, the package comprises an encapsulation block of a coating material formed on the front face of the board and encapsulating the chip, its said electrical connection means and the front terminals, the block having at least one opening which at least partially uncovers the front terminals.

According to an aspect, at least some of the front terminals are aligned in at least one row, the opening consisting of a straight groove which uncovers this row of front terminals.

According to an aspect, the ends of the groove preferably open onto two opposite sides of the encapsulation block.

According to an aspect, the package preferably comprises four rows of front terminals encircling the chip and four straight grooves which uncover the front terminals of these rows of front terminals, these grooves crossing over pairwise.

According to an aspect, the front terminals are preferably covered respectively with a layer of a soft electrically conductive material.

According to an aspect, the soft material is preferably a soldering paste.

An embodiment of the present invention also relates to a method for fabricating at least one semiconductor package, comprising fixing an integrated circuit chip on a front face of a board having electrical connection means and connecting electrical connection means of the chip to the electrical connection means of the board, the electrical connection means of the board comprising front electrical contact terminals arranged beyond the edges of the chip on the front face of this board.

According to an aspect, the method comprises encapsulating the chip, its said electrical connection means and the terminals in an encapsulation block of a coating material formed on the front face of the board, and producing at least one opening in the block which at least partially uncovers the terminals.

According to this method, at least some of the front terminals are preferably aligned in at least one row, the opening preferably consisting of a straight groove which uncovers this row of front terminals.

According to an aspect, the groove is preferably obtained with the aid of a tool such as a saw moved beyond the edges of the encapsulation block.

According to an aspect, the method comprises respectively preferably covering the terminals with a layer of a soft material before producing the encapsulation block.

According to an aspect, the opening is preferably obtained with the aid of a tool which reaches the electrically conductive paste-like layer.

In another embodiment, the method according to the invention may advantageously comprise fixing and electrically connecting a plurality of chips at aligned positions on a single board, so that at least some of the front terminals associated with these chips are aligned in at least one row, and producing an encapsulation block common to the chips, in producing at least one groove which at least partially uncovers the front terminals of the row, and cutting the board and the encapsulation block between the positions so as to individualize a plurality of semiconductor packages.

An embodiment of the present invention also relates to a stack of at least two semiconductor packages, in which a first semiconductor package comprises the semiconductor package described above and a second semiconductor package is arranged above the encapsulation block of the first package, the electrical connection between the packages being produced by electrical connection beads arranged in the at least one opening and in electrical contact with the front terminals.

An embodiment of the present invention also relates to a method for fabricating a stack of at least two semiconductor packages. This method comprises producing a first package as described above; producing a second semiconductor package carrying electrical connection beads which are arranged in correspondence with the front terminals of the first package; and installing the second package on the first package by engaging the beads in the at least one opening and by connecting these beads to the front terminals of the first package.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
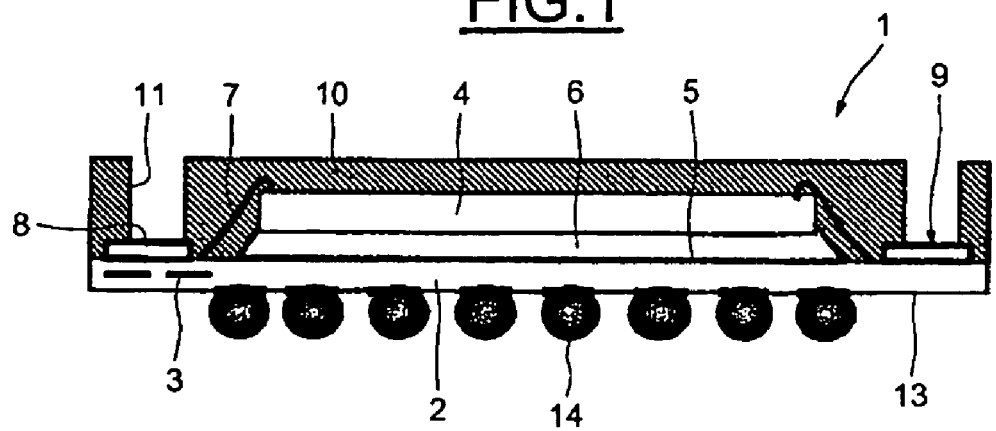
FIG. 1 represents a cross section of a semiconductor package according to the invention.
Figure 2:
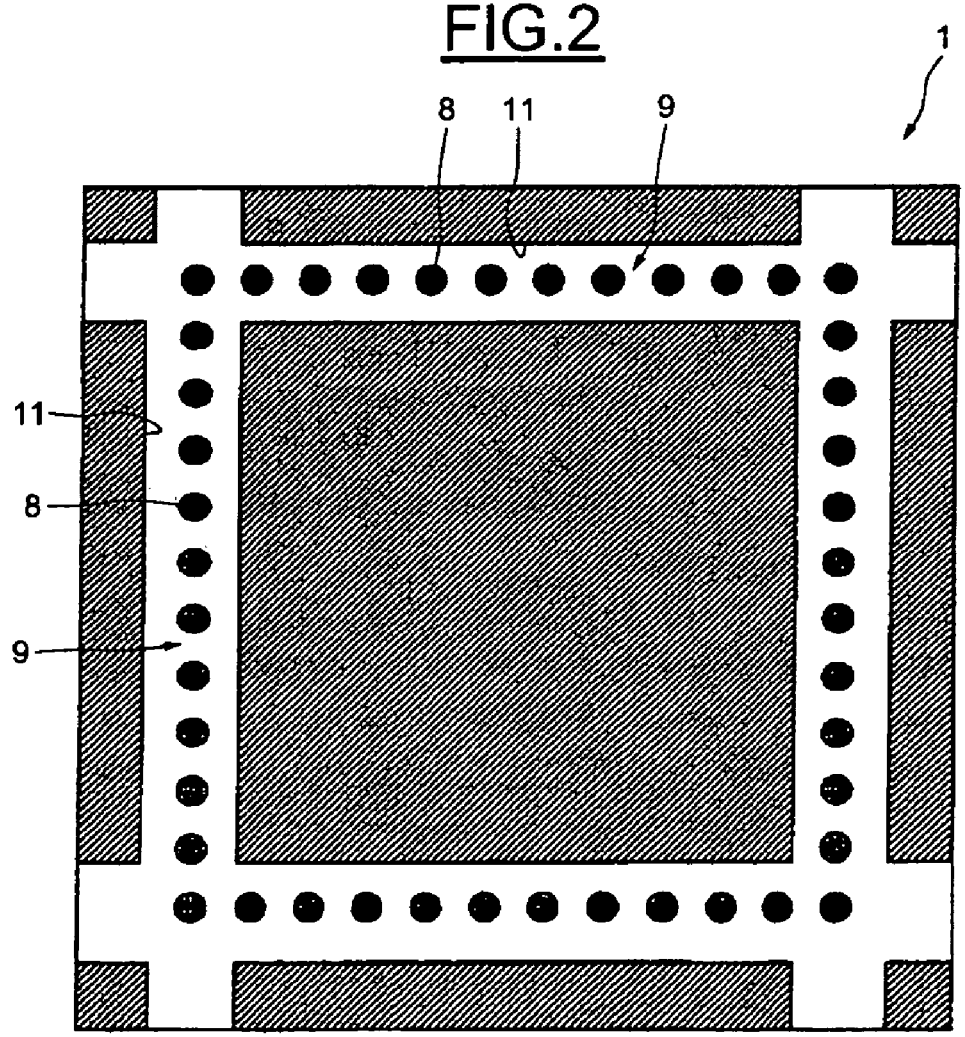
FIG. 2 represents a top view of the semiconductor package in FIG. 1.

Referring in particular to FIGS. 1 and 2, it can be seen that a semiconductor package 1 has been represented which comprises in a manner known per se a square board 2 provided with selective electrical connection means 3, a square integrated circuit chip 4 whose rear face is fixed on the front face 5 of the board 2 by means of an adhesive layer 6, and electrical connection wires 7 which connect front terminals of the chip 4 to front terminals of the electrical connection means 3 of the board 2, these front terminals lying outside and at a distance from the periphery of the chip 4.

The chip 4 is smaller than the board 2 and is placed in its middle, their sides being parallel.

Protruding front electrical contact terminals 8 are provided on the front face 5 of the board 2, and are selectively connected to its electrical connection means 3. These front terminals 8 are arranged in four rows 9 parallel to the sides of the chip 4, outside and at a distance from the aforementioned front terminals for connecting the wires 7 on the board 2.

The chip 4 and the electrical connection wires 7 are encapsulated in an encapsulation block 10 of a coating material, which covers the front face 5 of the board 2 and has a parallelepipedal shape.

Four straight grooves 11 are formed in the encapsulation block 10, constituting openings which extend parallel to the sides of the chip 4 or the sides of this block, open onto its sides and are produced with a depth such that the front faces of the front terminals 8 are partially uncovered, these grooves crossing over pairwise in proximity to the corners of the block 10.

Figure 5:
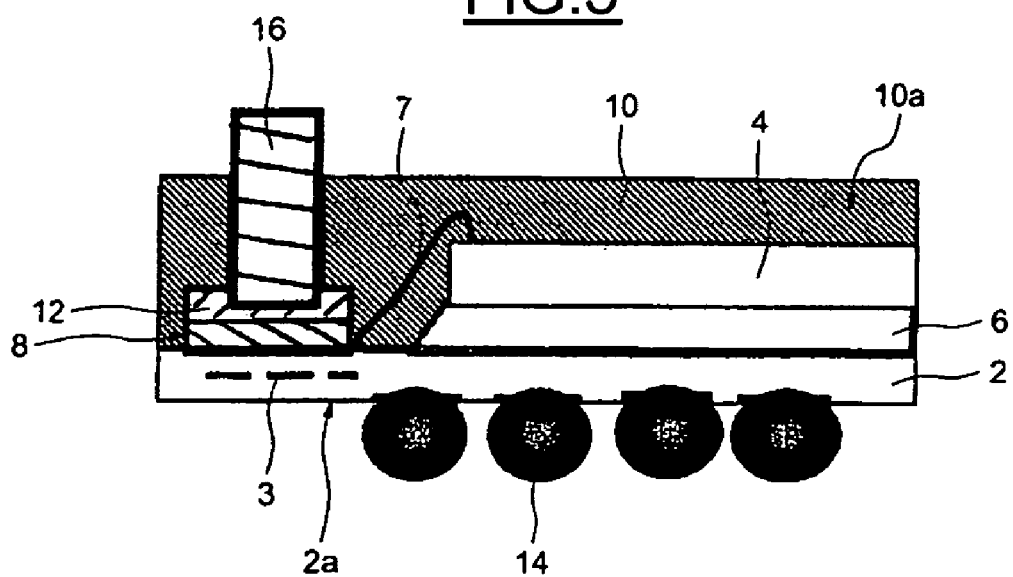
FIG. 5 represents an enlarged cross section of the set in FIG. 4.

As shown by FIG. 5, the front faces of the front terminals 8 are advantageously covered with a layer 12 of a paste-like electrically conductive material, the grooves 11 reaching to this layer 12.

External electrical connection beads 14 selectively connected to the connection means 3 are soldered onto the rear face 13 of the board 2, for example with a view to mounting the package 1 on a printed circuit board.

The following procedure may be adopted in order to fabricate the semiconductor package 1.

Figure 3:
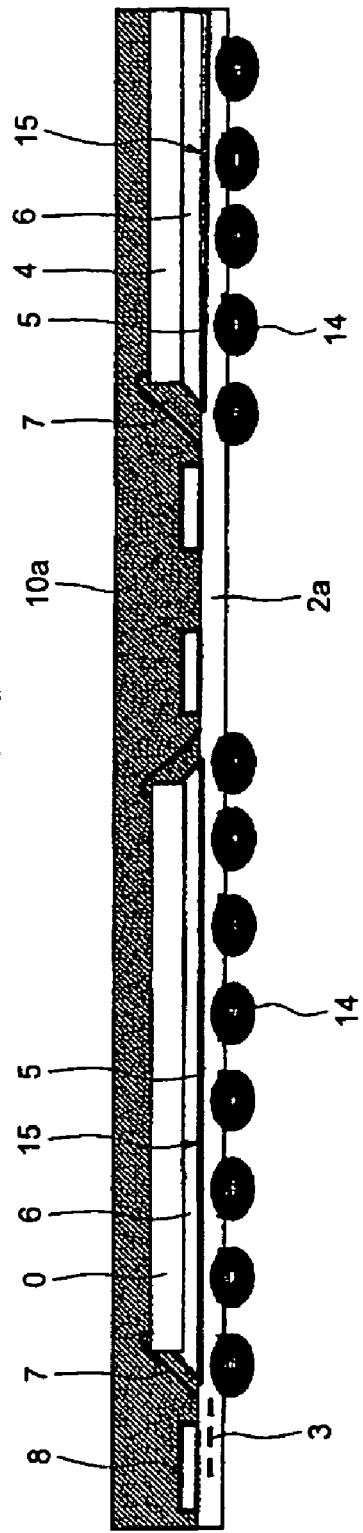
FIG. 3 represents a cross section of a set of semiconductor packages during fabrication.

As shown by FIG. 3, given a large board 2a having electrical connection means 3 and front terminals 8 at aligned adjacent positions 15, chips 4 are fixed on these positions 15, the electrical connection wires 7 associated with each chip 4 are installed, a large encapsulation block 10a of parallelepipedal shape is produced, in which the chips 4 and the electrical connection wires 7 are embedded, and the rear beads 14 are deposited and soldered. The rows 9 of front terminals 8 associated with the various chips 4 are respectively aligned in longitudinal and transverse lines.

Figure 4:
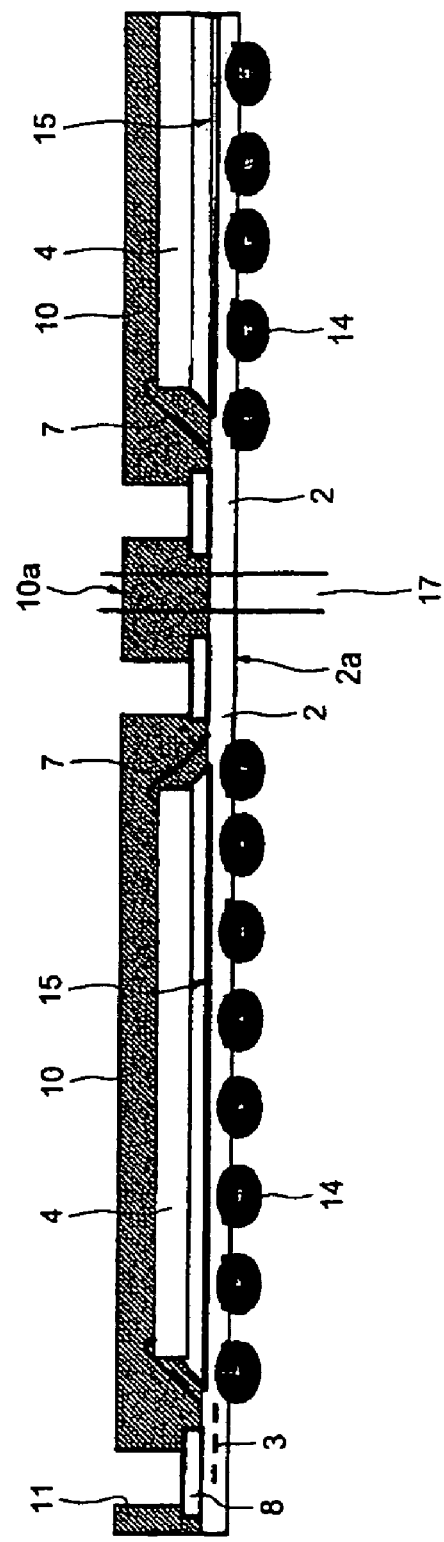
FIG. 4 represents a cross section of the set of semiconductor packages in FIG. 3 during a subsequent fabrication step.

Next, as shown by FIGS. 4 and 5, the straight grooves 11 are produced by using a saw 16 which is moved in a straight line longitudinally and transversely. Since the rows 9 of terminals 8 are respectively aligned, the corresponding grooves can be produced in a single operation. The saw 16 is adjusted so that the depth of the grooves 11 is such that the saw 16 passes through the layers 12 of paste-like material without reaching the front face of the front terminals 8.

Figure 6:
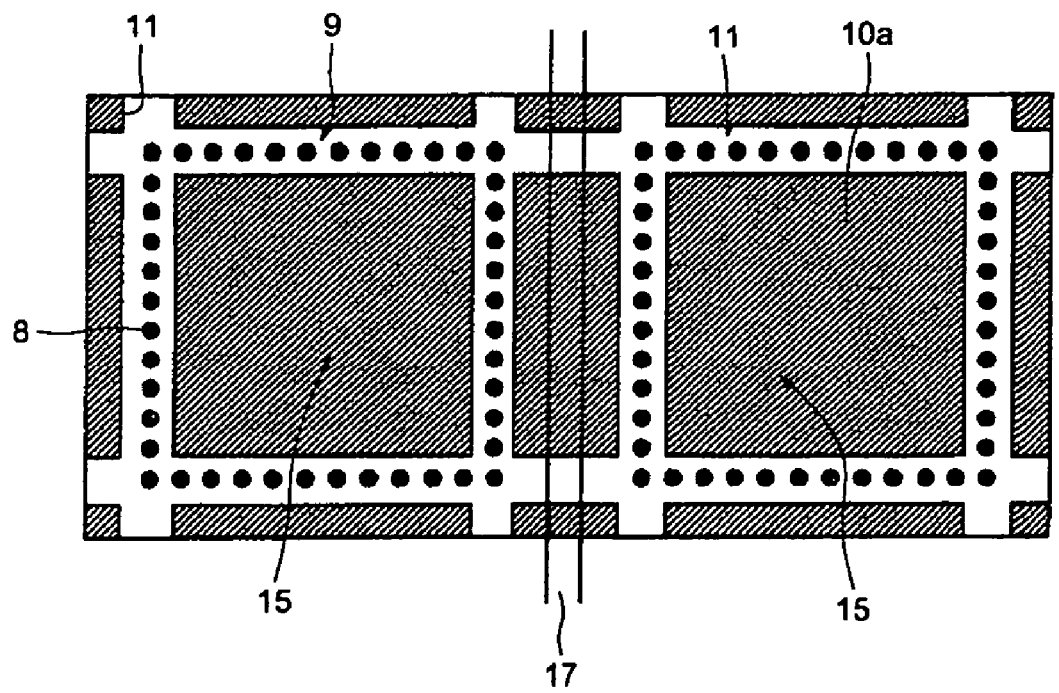
FIG. 6 represents a reduced top view of the set in FIG. 4.

After this, as shown by FIGS. 4 and 6, the large board 2a and the large block 10a are sawed in a straight line longitudinally and transversely between the positions 15, along the directions 17. As many packages 1 are then obtained as there were positions 15.

Figure 7:
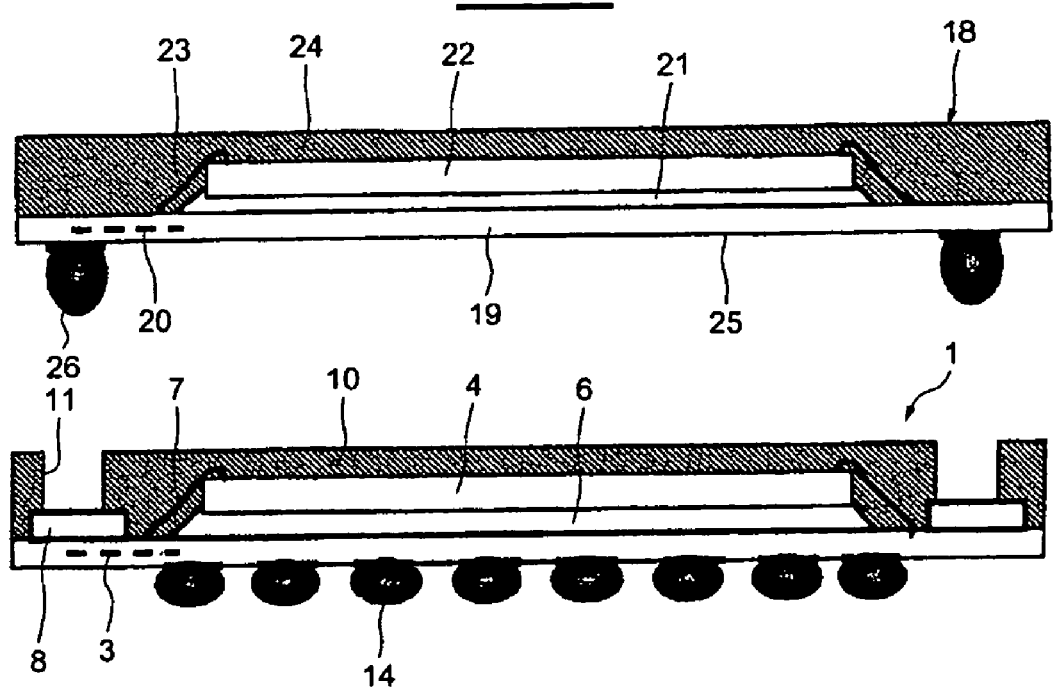
FIG. 7 represents a cross section of two semiconductor packages before they are stacked.
Figure 8:
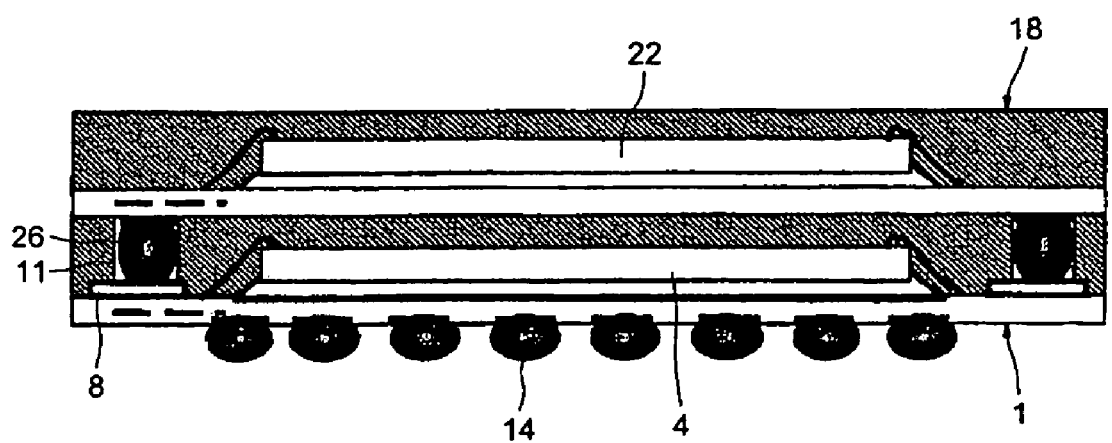
FIG. 8 represents a cross section of the two semiconductor packages stacked on each other.

As shown by FIGS. 7 and 8, a semiconductor package 18 may be stacked on the semiconductor package 1.

This package 18 comprises a board 19 which is provided with electrical connection means 20 and which carries on its front face 21 an integrated circuit chip 22 connected to these means 20 by electrical connection wires 23, this chip 22 and these wires 23 being embedded in an encapsulation block 24. On its rear face 25, the board 19 carries electrical connection beads 26 which are connected to the electrical connection means 20 and are arranged conformally with the arrangement of the front terminals 8 of the package 1.

In order to produce the aforementioned stack, the package 1 and the package 18 are brought together while engaging the electrical connection beads 26 of the package 18 in the grooves 11 of the encapsulation block 10 of the package 1, and the electrical connection beads 26 are respectively soldered onto the front faces of the front terminals 8, the layers 12 facilitating the soldering operation. The packages 1 and 18 are then fixed on one another and selectively connected electrically.

The dimensioning being such that the front face of the encapsulation block 10 of the package 1 comes onto or close to the rear face of the package 18, in one variant a layer of adhesive could furthermore be interposed between these front and rear faces.

In one variant, the package 18 could have the structure of the package 1. A third package could thus be stacked on such a package as described above, and so on.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor package comprising:

a board having electrical connection means, an integrated circuit chip fixed on a front face of the board, means for electrically connecting the chip to the electrical connection means of the board, wherein the electrical connection means of the board comprise front electrical contact terminals arranged beyond at least one edge of the chip on the front face of the board;

an encapsulation block of a coating material formed on the front face of the board and encapsulating the chip, the electrical connection means and the front electrical contact terminals, the block having at least one opening which at least partially uncovers plural ones of the front electrical contact terminals;

wherein the at least one opening comprises a groove formed in the encapsulation block, the groove extending over and uncovering the plural ones of the front electrical contact terminals; and wherein the plural ones of the front electrical contact terminals are aligned in at least one row, the groove comprising a straight groove extending over and uncovering this row of front electrical contact terminals.

2. The package according to claim 1, wherein the groove extends parallel to a first side of the encapsulation block, and ends of the groove open onto two opposite sides of the encapsulation block that are adjacent the first side.

3. A semiconductor package, comprising:
a board having electrical connection means, an integrated circuit chip fixed on a front face of the board, means for electrically connecting the chip to the electrical connection means of the board, wherein the electrical connection means of the board comprise front electrical contact terminals arranged beyond at least one edge of the chip on the front face of the board;

an encapsulation block of a coating material formed on the front face of the board and encapsulating the chip, the electrical connection means and the front electrical contact terminals, the block having at least one opening which at least partially uncovers plural ones of the front electrical contact terminals;

wherein the at least one opening comprises a groove formed in the encapsulation block, the groove extending over and uncovering the plural ones of the front electrical contact terminals; and further comprising four rows of front electrical contact terminals encircling the chip along four sides of the encapsulation block and four grooves along the four sides which uncover the front electrical contact terminals of these rows of front electrical contact terminals, pairs of these grooves crossing each other at corners of the encapsulation block.

4. The package according to claim 1, wherein the front electrical contact terminals are covered respectively with a layer of a soft electrically conductive material.

5. The package according to claim 4, wherein the soft material is a soldering paste.

6. A stack of at least two semiconductor packages, comprising:
a first semiconductor package including an encapsulation block wherein at least one straight groove is formed in a top surface of the encapsulation block, the straight groove extending over and at least partially uncovering a row of front terminals; and a second semiconductor package arranged above the encapsulation block of the first semiconductor package; and an electrical connection formed between the first and second semiconductor packages by electrical connection beads arranged to be received within the straight groove in the encapsulation block to make electrical contact between a bottom surface of the second semiconductor package and the front terminals uncovered by the straight groove in the encapsulation block of the first semiconductor package.

7. The stack of claim 6, wherein the bottom surface of the second semiconductor package is in contact with the top surface of the encapsulation block for the first semiconductor package.

8. The stack of claim 7, further including an adhesive for fixing the bottom surface of the second semiconductor package to the top surface of the encapsulation block.

9. The stack of claim 6, further including an electrically conductive paste-like material layer associated with the front terminals.

10. A semiconductor package comprising:
a board having electrical contact terminals on a front face of the board;

an integrated circuit chip fixed on the front face of the board and electrically connected to the electrical contact terminals, wherein the electrical contact terminals are arranged on the front face of the board at locations outside at least one edge of the chip;

an encapsulation block of a coating material formed on the front face of the board and encapsulating both the chip and the electrical contact terminals, the encapsulation block having at least one groove formed in a top surface of the encapsulation block which extends through the encapsulation block to expose plural ones of the electrical contact terminals on the front face of the board; and wherein at least some of the electrical contact terminals are aligned in at least one row, and wherein the groove formed in the top surface comprises a straight groove which uncovers this row of electrical contact terminals.

11. The package according to claim 10, wherein each of a first and second end of the straight groove opens onto opposite side edges of the encapsulation block.

12. The package according to claim 10, further comprising four rows of electrical contact terminals about a perimeter of the chip, the opening formed in the top surface comprising four corresponding straight grooves which uncover the rows of electrical contact terminals.

13. The package according to claim 10, wherein the electrical contact terminals are covered with a layer of a soft electrically conductive paste material positioned between the electrical contact terminals and the encapsulation block, the soft electrically conductive paste material being uncovered by the opening.

14. The package according to claim 13, wherein the soft material is a soldering paste.

15. A semiconductor package comprising:
a board having electrical contact terminals, an integrated circuit chip fixed on a front face of the board, electrical connections between the chip and the electrical contact terminals of the board, wherein the electrical contact terminals are arranged in a first row and a second row beyond at least one edge of the chip on the front face of the board;

an encapsulation block of a coating material formed on the front face of the board and encapsulating the chip, the electrical connections and the electrical contact terminals, the block having a first groove extending along a first side of the encapsulation block which at least partially uncovers the first row of electrical contact terminals, and having a second groove extending along a second side of the encapsulation block which at least partially uncovers the second row of electrical contact terminals.

16. The package of claim 15 wherein the first and second sides are adjacent, and the first and second grooves intersect each other at a corner of the encapsulation block.

17. The package of claim 15 wherein the first and second sides are opposite each other for the encapsulation block.

* * * * *